United States Patent
Chen et al.

(10) Patent No.: US 12,315,857 B2
(45) Date of Patent: May 27, 2025

(54) ELECTRONIC DEVICE COMPRISING AN ELECTROSTATIC DISCHARGE PROTECTIVE UNIT

(71) Applicant: Innolux Corporation, Miao-Li County (TW)

(72) Inventors: Jia-Yuan Chen, Miao-Li County (TW); Tsung-Han Tsai, Miao-Li County (TW); Kuan-Feng Lee, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 38 days.

(21) Appl. No.: 18/169,187

(22) Filed: Feb. 14, 2023

(65) Prior Publication Data
US 2023/0197704 A1    Jun. 22, 2023

Related U.S. Application Data

(63) Continuation of application No. 16/856,058, filed on Apr. 23, 2020, now Pat. No. 11,616,052.

(51) Int. Cl.
| H01L 25/16 | (2023.01) |
| H10H 20/01 | (2025.01) |
| H10H 20/857 | (2025.01) |

(52) U.S. Cl.
CPC .......... *H01L 25/167* (2013.01); *H10H 20/01* (2025.01); *H10H 20/857* (2025.01); *H10H 20/0364* (2025.01)

(58) Field of Classification Search
CPC .................................. H01L 23/60–62
See application file for complete search history.

(56) References Cited

U.S. PATENT DOCUMENTS

| 6,642,550 B1 * | 11/2003 | Whitworth | H01L 25/167 257/E25.032 |
| 2010/0147657 A1 * | 6/2010 | Sen | B82Y 10/00 977/742 |
| 2016/0247747 A1 * | 8/2016 | Janzen | H01L 24/17 |
| 2018/0151655 A1 * | 5/2018 | Kim | H10K 59/1213 |
| 2019/0341373 A1 * | 11/2019 | Yu | H01L 23/3121 |
| 2020/0051958 A1 * | 2/2020 | Hu | H01L 27/1214 |

* cited by examiner

*Primary Examiner* — Didarul A Mazumder
*Assistant Examiner* — Gustavo G Ramallo
(74) *Attorney, Agent, or Firm* — JCIPRNET

(57) ABSTRACT

An electronic device includes an object substrate, an electronic unit and an electrostatic discharge protective unit. The object substrate includes a bonding pad. The electronic unit includes an electrode bonding on the bonding pad. The electrostatic discharge protective unit is located in the object substrate and electrically connected to the bonding pad.

8 Claims, 15 Drawing Sheets

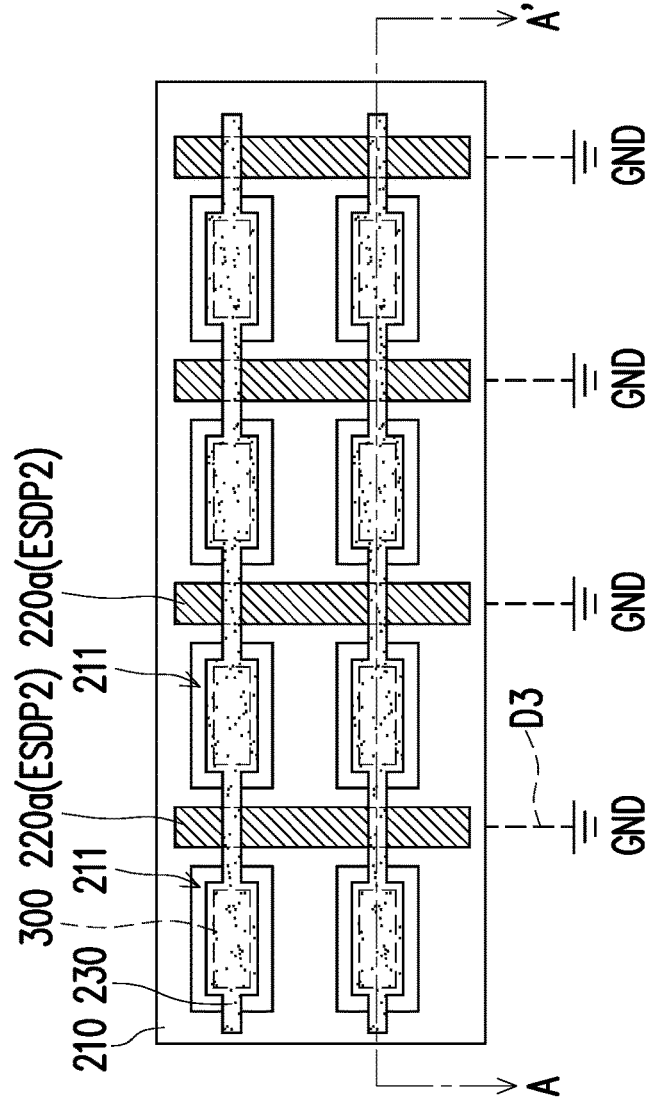
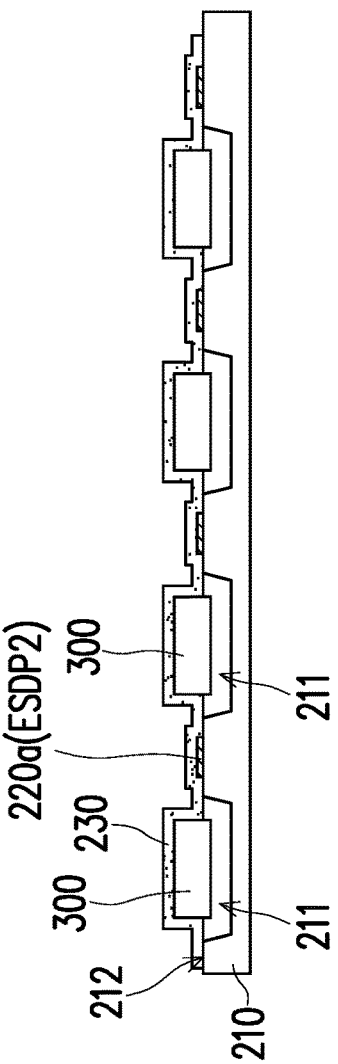
FIG. 2A
FIG. 2B

ELECTRONIC DEVICE COMPRISING AN ELECTROSTATIC DISCHARGE PROTECTIVE UNIT

CROSS-REFERENCE TO RELATED APPLICATION

This application is a continuation application of and claims the priority benefit of a prior application Ser. No. 16/856,058, filed on Apr. 23, 2020. The entirety of the above-mentioned patent applications is hereby incorporated by reference herein and made a part of this specification.

BACKGROUND

Technical Field

The disclosure relates to an electronic device, and more particularly to an electronic device having an electrostatic discharge protective unit.

Description of Related Art

Electronic products have become indispensable in the modern society so the electronic devices need to continue to improve, such as increasing the production yield or reducing a damaging from the electrostatic discharge.

SUMMARY

The disclosure is directed to an electronic device, which may utilize an electrostatic discharge protective unit to protect the electronic device from damage by an electrostatic discharge.

According to an embodiment of the disclosure, an electronic device includes an object substrate, an electronic unit and an electrostatic discharge protective unit. The object substrate includes a bonding pad. The electronic unit includes an electrode bonding on the bonding pad. The electrostatic discharge protective unit is located in the object substrate and electrically connected to the bonding pad.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of the specification. The drawings illustrate exemplary embodiments of the disclosure and, together with the description, serve to explain the principles of the disclosure.

FIG. 2A is a schematic top view of a carrier substrate when transferring a plurality of light emitting units according to another embodiment of the disclosure.

FIG. 2B is a schematic cross-sectional view of the carrier substrate of FIG. 2A along the section line A-A'.

DESCRIPTION OF THE EMBODIMENTS

Figure 1:
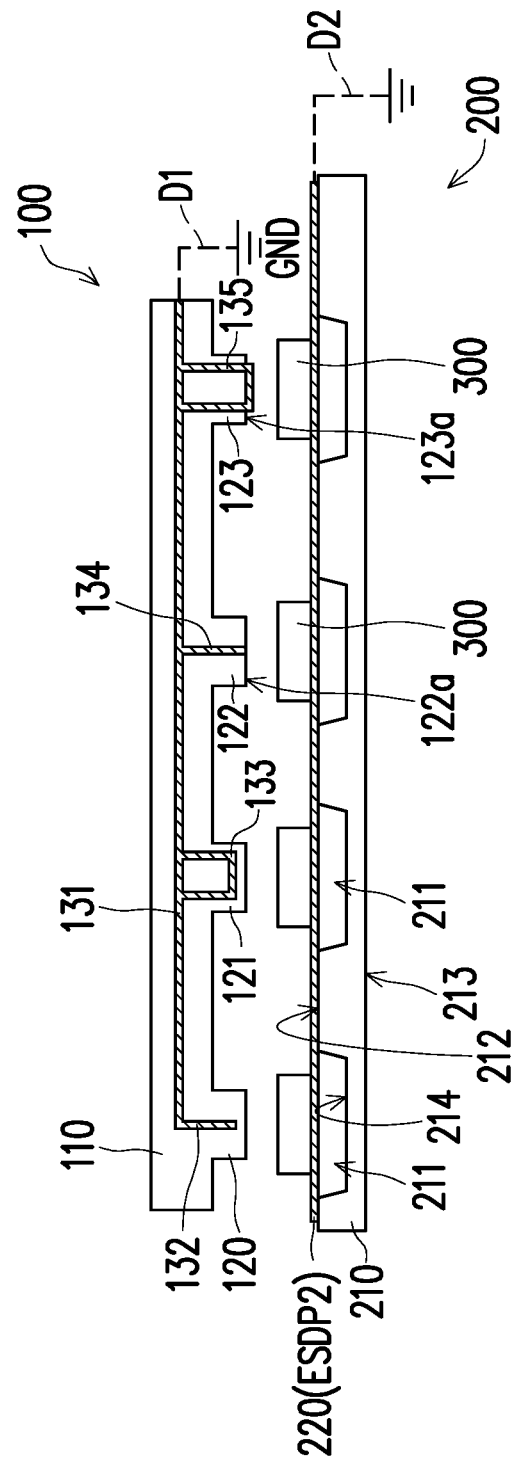
FIG. 1 is a schematic cross-sectional view of a pick-and-place tool and a carrier substrate when transferring a plurality of light emitting units according to an embodiment of the disclosure.

The disclosure can be understood by referring to the following detailed description in conjunction with the accompanying drawings. It should be noted that in order to make the reader easy to understand and for the sake of simplicity of the drawings, the multiple drawings in the disclosure only depict a part of the electronic device, and certain elements in the drawings are not drawn according to actual scale. In addition, the number and size of each element in the figure are only for illustration, and are not intended to limit the scope of the present disclosure.

In the following specification and claims, the words "containing" and "including" are open-ended words, and therefore they should be interpreted as meaning "including but not limited to".

It will be understood that when an element or layer is referred to as being "(electrically) connected to" another element or layer, it can be directly (electrically) connected to the other element or layer, or intervening elements or layers may be presented. In contrast, when an element is referred to as being "directly (electrically) connected to" another element or layer, there are no intervening elements or layers presented. In contrast, when an element is referred to as being "disposed on" or "formed on" A element, it may be directly disposed on (or formed on) A element, or may be indirectly disposed on (or formed on) A element through other component. In contrast, when an element is referred to as being "disposed between" A element and B element, it may be directly disposed between A element and B element, or may be indirectly disposed between A element and B element through other component.

The terms "about", "substantially", "equal", or "same" generally mean within 20% of a given value or range, or mean within 10%, 5%, 3%, 2%, 1%, or 0.5% of a given value or range. In addition, the phrase "in a range from a first value to a second value" indicates the range includes the first value, the second value, and other values in between.

It will be understood that when "A element is electrically connected to the thin film transistor" or "A element is electrically connected to the B element through the thin film transistor", which may be in a condition that the thin film transistor is turned on.

The electronic device of the disclosure may include, but is not limited to, a display device, an antenna device, a lighting device, a sensing device, a touch device, a curved device, or a free shape device, a bendable device, a flexible device or a tiled device. The electronic device may include LED (light-emitting diode) display, micro-LED display, mini-LED display, a quantum dots LEDs (QLEDs or QD-LEDs) display, fluorescence materials, phosphor materials, other suitable displays, or a combination thereof, but not limited thereto.

Although the terms first, second, third etc. can be used to describe various constituent elements, the constituent elements are not limited by the term. The term is only used to distinguish a single constituent element from other constituent elements in the specification. The same terms may not be used in the claims, but may be replaced by first, second, third, etc. in the order of element declarations in the claims. Therefore, in the following specification, a first constituent element may be a second constituent element in the claims.

In some embodiments of the present disclosure, unless specifically defined otherwise, the terms related to joining and connection, such as "connected" and "interconnected", may refer to two structures being in direct contact, or may refer to two structures not being in direct contact and other structures are provided between the two structures. Moreover, the terms about joining and connecting may include a case where two structures are movable or two structures are fixed. In addition, the term "coupled" includes any direct and indirect electrical connection means.

It should be noted that the technical features in different embodiments described in the following can be replaced, recombined, or mixed with one another to constitute another embodiment without departing from the spirit of the present disclosure.

Reference will now be made in detail to the exemplary embodiments of the disclosure, examples of which are illustrated in the accompanying drawings. Whenever possible, the same reference numerals are used to represent the same or similar parts in the accompanying drawings and description.

In the present embodiment, a method for manufacturing an electronic device includes transferring a plurality of light emitting units from a carrier substrate to an object substrate under protection of at least one electrostatic discharge protective unit. In detail, transferring the plurality of light emitting units from the carrier substrate to the object substrate may include the following steps: 1) picking the plurality of light emitting units from the carrier substrate by a pick-and-place tool, and then 2) placing the plurality of light emitting units onto the object substrate.

In addition, in the step of picking the plurality of light emitting units from the carrier substrate by the pick-and-place tool, when the pick-and-place tool contacts the plurality of light emitting units on the carrier substrate, electrostatic discharge may be generated to damage the plurality of light emitting units. In the step of placing the plurality of light emitting units onto the object substrate, when the plurality of light emitting units located on the pick-and-place tool contact to the object substrate, electrostatic discharge also may be generated to damage the plurality of light emitting units or the object substrate.

In addition, the steps (the steps 1 and the step 2) may be both performed under a protection by at least one electrostatic discharge protective unit (such as the following first electrostatic discharge protective unit ESDP1, second electrostatic discharge protective unit ESDP2, and/or third electrostatic discharge protective unit ESDP3).

Therefore, in some embodiments, an electrostatic discharge protective unit may be provided in the pick-and-place tool to reduce the electrostatic discharge generated in the above two steps from damaging the plurality of light emitting units or the object substrate. In some embodiments, electrostatic discharge protective units may be provided in the carrier substrate and/or the object substrate to reduce the electrostatic discharge generated in the above two steps from damaging the plurality of light emitting units or the object substrate. In some embodiments, electrostatic discharge protective units may be provided in the pick-and-place tool, the carrier substrate and/or the object substrate to reduce the electrostatic discharge generated in the above two steps from damaging the plurality of light emitting units or the object substrate.

In the following, several embodiments will be listed in conjunction with the drawings to explain in detail how to configure the electrostatic discharge protective units in the pick-and-place tool, the carrier substrate and/or the object substrate.

FIG. 1 is a schematic cross-sectional view of a pick-and-place tool and a carrier substrate when transferring a plurality of light emitting units according to an embodiment of the disclosure.

Referring to FIG. 1, in the present embodiment, a pick-and-place tool 100 includes a body 110, some grasping heads 120, 121, 122, 123 and a conductive metal wire 130. The conductive metal wire 130 includes a body portion 131 and a plurality of extension portions 132, 133, 134, 135. The body portion 131 is disposed in the body 110 of the pick-and-place tool 100, and the plurality of extension portions 132, 133, 134, 135 of the conductive metal wire 130 are respectively extended from the body portion 131 to different grasping heads 120, 121, 122, 123, and the extension portions 132, 133, 134, 135 are in different patterns, but is not limited thereto. For example, the extension portion 132 extended into the grasping head 120 is a linear pattern. The extension portion 133 extended into the gripping head 121 is a loop pattern, the extension portion 134 extended to a surface 122a of the grasping head 122 facing the plurality of light emitting units 300 is a linear pattern, the extension portion 135 extended to a surface 123a of the grasping head 123 facing the plurality of light emitting units 300 is a loop pattern, but is not limited thereto. In other embodiment, the pattern of the plurality of extension portions 132, 133, 134, 135 may change according to demand. In some embodiments, a material of the grasping heads 120, 121, 122, 123 may include polydioxanone (PDS)-based polymer material, viscous material, elastic material, polydimethylsiloxane (PDMS) or a combination of the above, but is not limited thereto. In some embodiments (not shown), the extension portions of the conductive metal wire disposed in different gripping heads may also have the same pattern.

Then, the body portion 131 of the conductive metal wire 130 is connected to a ground GND or low potential voltage (not shown) by a wire, as shown by a dotted line D1.

Therefore, during the step of transferring the plurality of light emitting units 300 from a carrier substrate 200 to the object substrate (not shown), an electrostatic discharge generated when the grasping heads 120, 121, 122, 123 of the pick-and-place tool 100 contact the plurality of light emitting units 300 on the carrier substrate 200 can be reduced or removed by grounding the conductive metal wire 130. As a result, the generated electrostatic discharge can be reduced or removed to reduce a damaging of the plurality of light emitting units 300. Therefore, in the present embodiment, the conductive metal wire 130 located in the pick-and-place tool 100 can be regarded as a first electrostatic discharge protective unit ESDP1. In other words, the first electrostatic discharge protective unit ESDP1 is located in the pick-and-place tool 100. In other embodiment, the first electrostatic discharge protective unit ESDP1 may include the conductive metal wires 130 and/or a switching element.

In the present embodiment, the carrier substrate 200 includes a substrate 210, a first conductive metal wire 220. The substrate 210 includes a plurality of recesses 211, a first surface 212, and a second surface 213 opposite to the first surface 212. The plurality of recesses 211 expose the third surface 214 of the substrate 210. The first conductive metal wire 220 is disposed on the first surface 212 of the substrate 210 and the plurality of recesses 211. In some embodiments, air can located between the recesses 211 and the first conductive metal wire 220. The plurality of light emitting units 300 are disposed on the first conductive metal wire 220, and the plurality of light emitting units 300 respectively overlaps the recesses 211, bit it is limited thereto. N-type electrode (not shown) of the light emitting units 300 are in contact with and electrically connected to the first conductive metal wire 220, and P-type electrode (not shown) of the light emitting units 300 are in contact with and electrically connected to a second conductive metal wire (not shown). The second conductive metal wire is disposed on the first surface 212 of the substrate 210.

Before the step of transferring the plurality of light emitting units 300 from the carrier substrate 200 to the object substrate (not shown), an testing may be performed on the plurality of light emitting units 300 by respectively applying different signals to the first conductive metal wire 220 and the second conductive metal (not shown) to ensure the normal operation of the plurality of light emitting units 300.

Then, after performing the testing, the conductive metal wire 220 can be connected to the ground GND (as shown by the dotted line D2), and the plurality of light emitting units can be transferred. During the step of transferring the plurality of light emitting units 300 from the carrier substrate 200 to the object substrate (not shown), the electrostatic discharge generated when the grasping heads 120, 121, 122, 123 of the pick-and-place tool 100 contact the plurality of light emitting units 300 on the carrier substrate 200 can be reduced or removed by grounding the conductive metal wire 220 located in the carrier substrate 200, it can reduce damaging of the plurality of light emitting units 300. Therefore, in the present embodiment, the conductive metal wire 220 provided in the carrier substrate 200 can be regarded as a second electrostatic discharge protective unit ESDP2, but is not limited thereto. In other words, the second electrostatic discharge protective unit ESDP2 is located in the carrier substrate 200, and the second electrostatic discharge protective unit ESDP2 is the conductive metal wire 220.

FIG. 2A is a schematic top view of a carrier substrate when transferring a plurality of light emitting units according to another embodiment of the disclosure. FIG. 2B is a schematic cross-sectional view of the carrier substrate of FIG. 2A along the section line A-A'. Please refer to FIG. 1 and FIGS. 2A-2B, the carrier substrate 200a in the present embodiment is substantially similar to the carrier substrate 200 in FIG. 1. The carrier substrate 200a is different from the carrier substrate 200 mainly in that: the carrier substrate 200a further includes a fixing layer 230 disposed on the plurality of conductive metal wires 220a and the plurality of light emitting units 300, and the plurality of conductive metal wires 220a do not contact with the plurality of light emitting units 300. The electrostatic charges generated when the grasping heads 120, 121, 122, 123 of the pick-and-place tool 100 contact the plurality of light emitting units 300 on the carrier substrate 200a can be transfer by the fixing layer 230 to the conductive metal wires 220a, the electrostatic charges may be removed by grounding the conductive metal wires 220a (which be regarded as a second electrostatic discharge protective unit ESDP2 located in the carrier substrate 200a). In other word, the conductive metal wire 220a is connected to a ground GND (or low potential, not shown), as shown by the dashed line D3. In some embodiments, a material of the fixing layer 230 may include silicon nitride, silicon oxide, other suitable materials or combination of the above, but is not limited thereto.

The plurality of light emitting units 300 overlap with the recesses 211, the fixing layer 230 is disposed on the first surface 212 of the substrate 210 and/or covers at least portion of the plurality of light emitting units 300, a portion of the plurality of recesses 211, and a portion of the conductive metal wires 220a.

Therefore, during the step of transferring the plurality of light emitting units 300 from a carrier substrate 200a to the object substrate (not shown), an electrostatic discharge generated when the grasping heads of the pick-and-place tool contact the plurality of light emitting units 300 on the carrier substrate 200a can be reduced or removed by grounding the conductive metal wires 220a. As a result, the generated electrostatic discharge can be removed to reduce damaging of the plurality of light emitting units 300. Therefore, in some embodiments, the conductive metal wires 220a provided in the carrier substrate 200a can be regarded as a second electrostatic discharge protective unit ESDP2. In other words, the second electrostatic discharge protective unit ESDP2 is located in the carrier substrate 200a and the second electrostatic discharge protective unit ESDP2. In some embodiments (not shown), a shape of the recesses 211 is not limited rectangles, the recesses 211 may include polygons shape, curved shape or other suitable shapes.

Figure 3A:
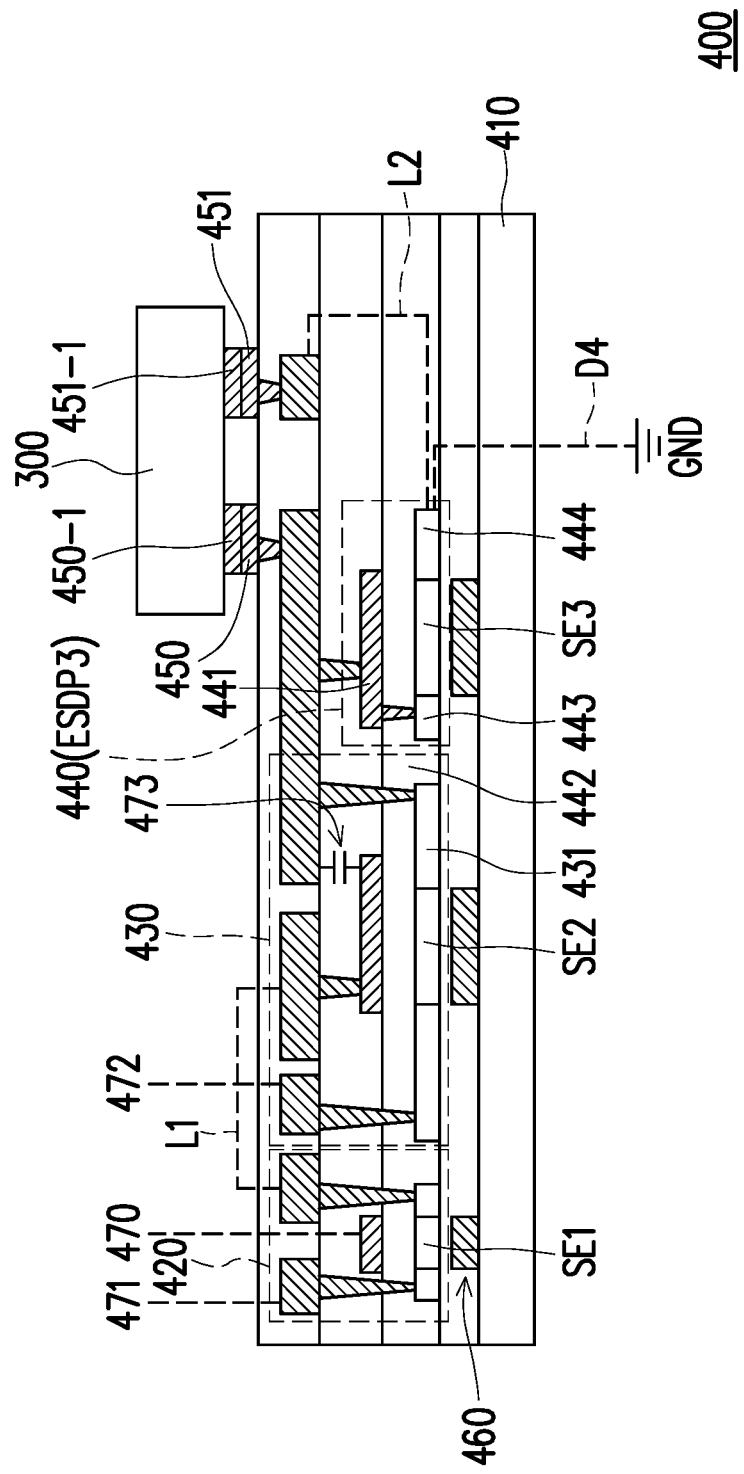
FIG. 3A is a schematic cross-sectional view of an object substrate when transferring a plurality of light emitting units according to another embodiment of the disclosure.
Figure 3B:
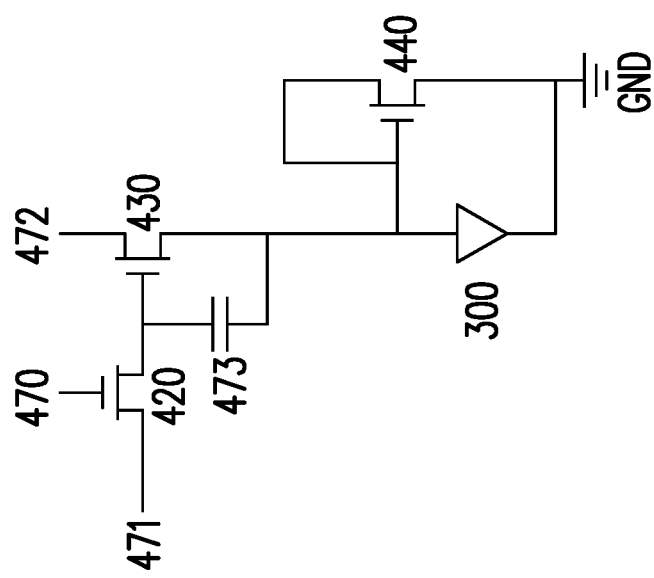
FIG. 3B is a schematic circuit diagram of the object substrate in FIG. 3A.

FIG. 3A is a schematic cross-sectional view of an object substrate when transferring a plurality of light emitting units according to another embodiment of the disclosure. FIG. 3B is a schematic circuit diagram of the object substrate in FIG. 3A. Referring to FIG. 3A and FIG. 3B, in the present embodiment, an object substrate 400 includes a substrate 410, a first thin film transistor 420 (such as a switching transistor), a second thin film transistor 430 (such as a driving transistor), a first switching element 440, a plurality of bonding pads (such as a P-type bonding pad 450 and an N-type bonding pad 451) and a patterned shading layer 460. The substrate 410 may be a flexible substrate, a rigid substrate or a combination thereof. For example, a material of the substrate 410 may include metal, plastic, glass, quartz, sapphire, ceramic, polycarbonate (PC), polyimide (PI), polyethylene terephthalate (PET), glass fiber, other suitable substrate materials or a combination of the above, but is not limited thereto.

The patterned shading layer 460 is disposed on the substrate 410. The first thin film transistor 420, the second thin film transistor 430 and the first switching element 440 are respectively disposed on the patterned shading layer 460. The second thin film transistor 430 is located between the first thin film transistor 420 and the first switching element 440, and the second thin film transistor 430 is electrically connected between the first thin film transistor 420 and the first switching element 440. The projection of the patterned shading layer 460 on the substrate 410 overlaps the projection of a channel region SE1 of the first thin film transistor 420, a channel region SE2 of the second thin film transistor 430 and a channel region SE3 of the first switching element 440 on the substrate 410, respectively. The channel region SE1, the channel region SE2 and/or the channel region SE3 formed of the same semiconductor layer or different semiconductor layers.

In addition, the first thin film transistor 420 (such as a drain of the first thin film transistor 420) is electrically connected to the second thin film transistor 430 (such as a gate of the second thin film transistor 430) through a wire of other cross-section (as shown by the dashed line L1). The first switching element 440 includes a gate 441, a source region 443, a drain region 444 and the channel region SE3, a portion of a gate insulating layer 442 is disposed between the channel region SE3 and the gate 441, but is not limited thereto. In some embodiments, the gate 441 of the first switching element 440 is electrically connected to the source region 443 of the first switching element 440, but is not limited thereto. In some embodiments, a drain region 431 of the second thin film transistor 430 is electrically connected to the gate 441 of the first switching element 440 and the P-type bonding pad 450. In the present embodiment, a N-type bonding pad 451 may be electrically connected to the drain region 444 of the first switching element 440 through a wire of other cross-section (as shown by the dashed line L2), but is not limited thereto. In other embodiments, the N-type bonding pad 451 may not be electrically connected to the first switching element 440 (such as a drain region 444 of the first switching element 440), and the N-type bonding pad 451 may be electrically connected to the ground (not shown) or low potential (not shown). In the present embodiment, the first switching element 440 disposed in a pixel region of the object substrate 400 is connected to a ground GND (or low potential (not shown)) through the drain region 444 of the first switching element 440, as shown by a dotted line D4. The pixel region can be defined by the scan lines and the data lines, the scan lines 470 (not shown in the FIG. 3A, but can refer the FIG. 3B) and the data lines 471 (not shown in the FIG. 3A, but can refer the FIG. 3B) are interleaved to form multiple pixel region.

Therefore, during the step of transferring the plurality of light emitting units 300 from a carrier substrate (not shown) to the object substrate 400, and the plurality of light emitting units 300 may be picked by the pick-and-place tool (not shown), an electrostatic discharge generated when a P-type electrode 450-1 of the light emitting unit 300 contact to the P-type bonding pad 450 of the object substrate 400, and/or a N-type electrode 451-1 of the light emitting unit 300 contact to the N-type bonding pad 451 of the object substrate 400, the electrostatic discharge can be reduced or removed by grounding the bonding pad of the object substrate 400 (such as the N-type bonding pad 451), and the generated electrostatic discharge can be reduced or removed to reduce damaging the plurality of light emitting units 300 and/or the object substrate 400. In the present embodiment, the switches (such as the first switching element 440) located in the object substrate 400 can be regarded as a third electrostatic discharge protective unit ESDP3. In other words, the at least one third electrostatic discharge protective unit ESDP3 is located in the object substrate 400. In some embodiments, the at least one third electrostatic discharge protective unit ESDP3 located in the object substrate 400 is electrically connected to the plurality of bonding pads (such as P-type bonding pads 450 of the object substrate 400). In some embodiments, the at least one third electrostatic discharge protective unit ESDP3 located in the object substrate 400 comprises a plurality of switches (such as the first switching element 440) for grounding the bonding pads (such as P-type bonding pads 450) during the step of transferring the plurality of light emitting units 300 from the carrier substrate 200 (or 200a) to the object substrate 400.

In the present embodiment, the object substrate 400 may further include scan lines 470, data lines 471, power supply lines 472 (such as VDD), capacitance 473, common voltage wires (not shown) and/or signal reference wires (not shown, such as VSS), but is not limited thereto.

Figure 4A:
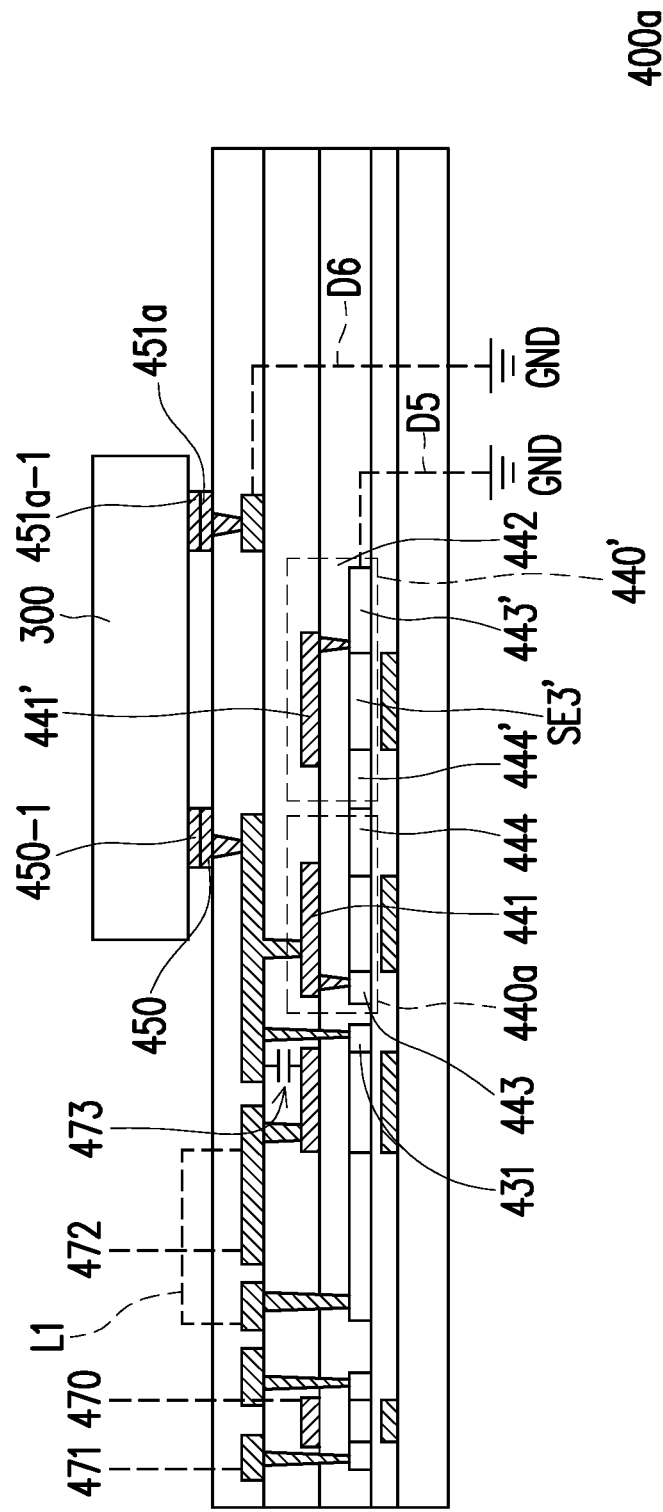
FIG. 4A is a schematic cross-sectional view of an object substrate when transferring a plurality of light emitting units according to another embodiment of the disclosure.
Figure 4B:
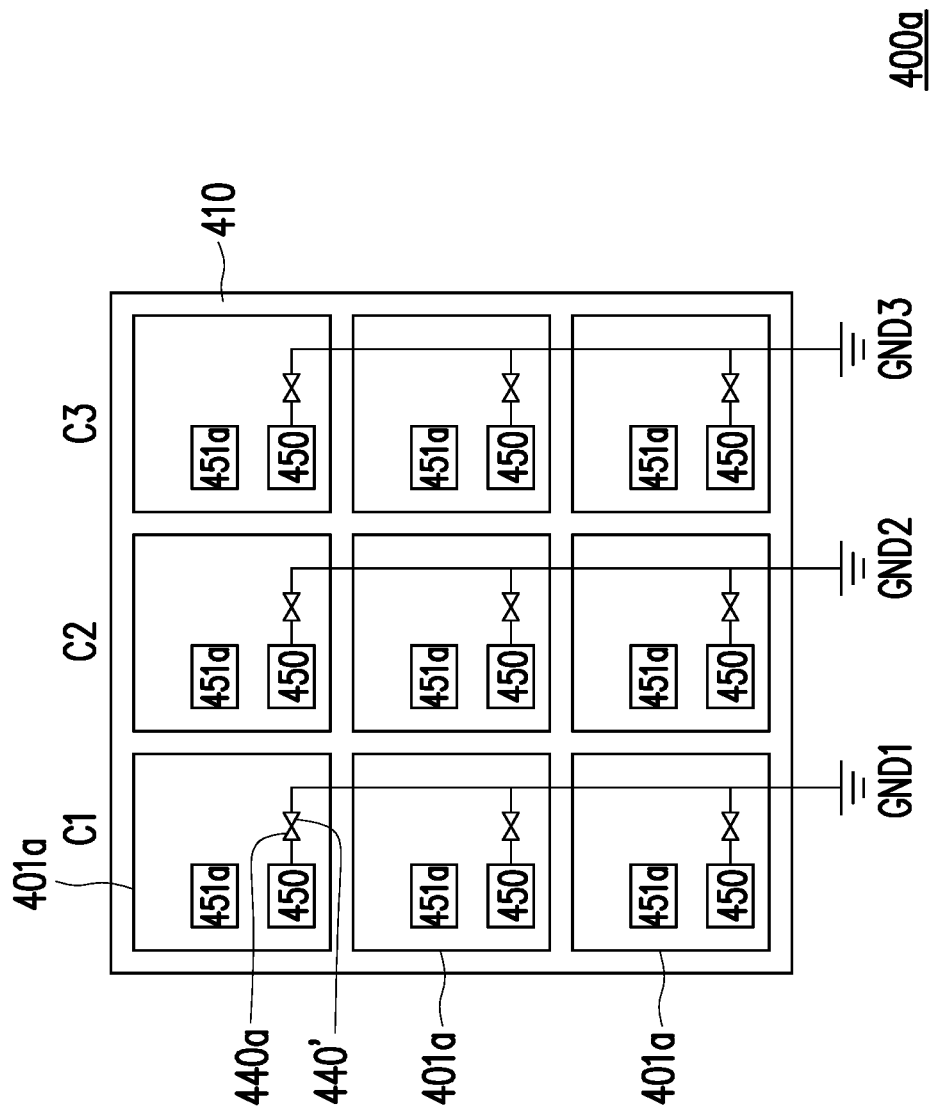
FIG. 4B is a schematic top view of grounding the electrostatic discharge protective units of the object substrate in FIG. 4A.

FIG. 4A is a schematic cross-sectional view of an object substrate when transferring a plurality of light emitting units according to another embodiment of the disclosure. FIG. 4B is a schematic top view of grounding the electrostatic discharge protective units of the object substrate in FIG. 4A. Please referring to FIG. 3A and FIG. 4A, an object substrate 400a is substantially similar to the object substrate 400 in FIG. 3A. The object substrate 400a is different from the object substrate 400 mainly in that: the object substrate 400a further includes a second switching element 440', and the second switching element 440' may be electrically connected to a first switching element 440a. In some embodiments, the second switching element 440' (the switch in claim) includes a gate 441', a source region 443', a drain region 444' and a channel region SE3'. The gate 441' of the second switching element 440' is electrically connected to the source region 443' of the second switching element 440'. In addition, in the present embodiment, the drain region 444' of the second switching element 440' can contact and/or be electrically connected to the drain region 444 of the first switching element 440a, a configuration structure of the first switching element 440a and the second switching element 440' can be regarded as a back-to-back diode. In other word, the at least one third electrostatic discharge protective unit ESDP3 located in the object substrate 400a comprises back-to-back diode.

In some embodiments, the second switching element 440' disposed in a pixel region of the object substrate 400a is connected to a ground GND (or low potential, not shown) through the source region 443' of the second switching element 440', as shown by a dotted line D5. In other words, the P-type bonding pad 450 can be electrically connected to the ground GND (or low potential, not shown) through the first switching element 440a and the second switching element 440'. In some embodiments, N-type bonding pad 451a may be electrically connected to a ground GND (as shown by the dashed line D6), but is not limited thereto.

Therefore, in the present embodiment, the configuration structure of the first switching element 440a and the second switching element 440' (back-to-back diode) provided in the object substrate 400a can be regarded as a third electrostatic discharge protective unit ESDP3. In other words, the third electrostatic discharge protective unit ESDP3 is the configuration structure of the first switching element 440a and the second switching element 440'. The third electrostatic discharge protective unit ESDP3 is located in the object substrate 400a, and the third electrostatic discharge protective unit ESDP3 is electrically connected to the bonding pad of the object substrate 400a (such as the P-type bonding pad 450).

Referring again to FIG. 4B, the object substrate 400a has a plurality of sub-pixel regions 401a arranged on the substrate 410 in an array substrate (schematically shown as 9 sub-pixel regions in FIG. 4B, but is not limited thereto). The P-type bonding pad 450 in the sub-pixel regions 401a of a first column C1 is connected to the ground line GND1 through the corresponding first switching element 440a and/or the corresponding second switching element 440', but is not limited thereto. In addition, the P-type pad 450 in the sub-pixel regions 401a of a second column C2 is connected to the ground line GND2 through the corresponding first switching element 440a and the corresponding second switching element 440'. The P-type pad 450 in the sub-pixel regions 401a of a third column C3 is connected to the ground line GND3 through the corresponding first switching element 440a and the corresponding second switching element 440'. In some embodiments, the ground line GND1, the ground line GND2 and/or the ground line GND3 may be electrical connect each other, but is not limited thereto.

Figure 5A:
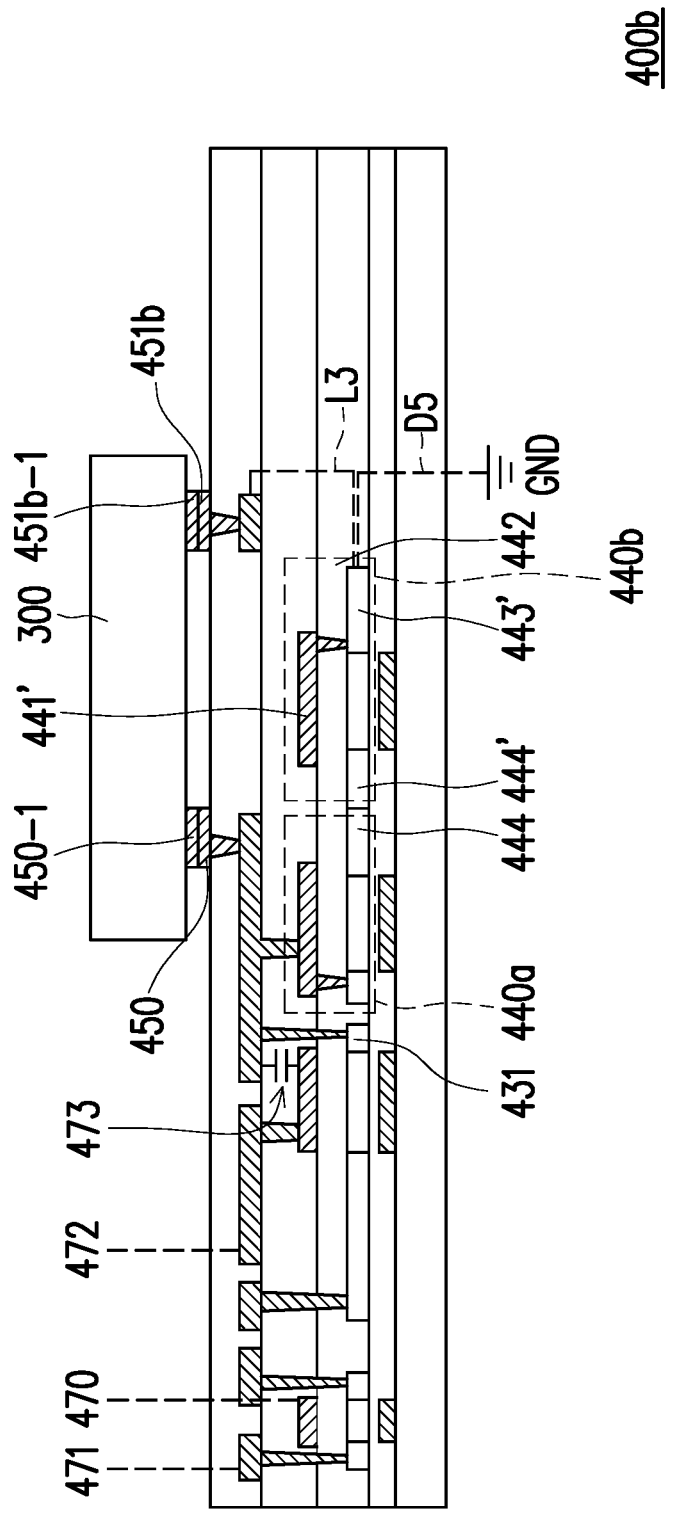
FIG. 5A is a schematic cross-sectional view of an object substrate when transferring a plurality of light emitting units according to another embodiment of the disclosure.
Figure 5B:
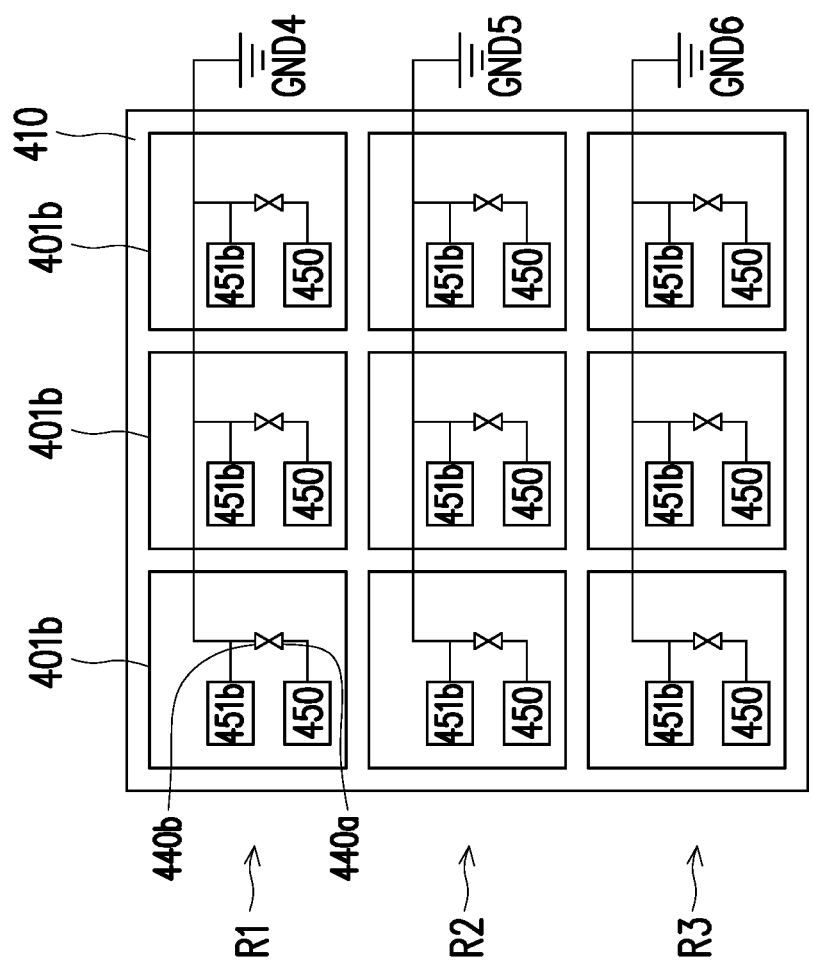
FIG. 5B is a schematic top view of grounding the electrostatic discharge protective units of the object substrate in FIG. 5A.

FIG. 5A is a schematic cross-sectional view of an object substrate when transferring a plurality of light emitting units according to another embodiment of the disclosure. FIG. 5B is a schematic top view of grounding the electrostatic discharge protective units of the object substrate in FIG. 5A. Please referring to FIGS. 4A-4B and FIGS. 5A-5B, an object substrate 400b is substantially similar to the object substrate 400a in FIGS. 4A-4B. The object substrate 400b is different from the object substrate 400a mainly in that: a N-type bonding pad 451b of the object substrate 400b is electrically connected to the second switching element 440b. Specifically, as shown in FIG. 5A, in the present embodiment, the N-type bonding pad 451b of the object substrate 400b is electrically connected to a source region 443' of the second switching element 440b through a wire of another cross section (as shown by a dotted line L3).

Referring to FIG. 5B, in the present embodiment, the object substrate 400b has a plurality of sub-pixel regions 401b arranged on the substrate 410 in an array (schematically shown as 9 sub-pixel regions in FIG. 5B, but is not limited thereto). The P-type bonding pad 450 in the sub-pixel regions 401b of a first row R1 are connected to the ground line GND4. The N-type bonding pad 451b and the P-type bonding pad 450 in the sub-pixel regions 401b are electrical connected through the corresponding first switching element 440a and the corresponding second switching element 440b, and the P-type pad 450 and the N-type bonding pad 451b in the sub-pixel regions 401a of a first row R1 are connected to the ground line GND4. In addition, the P-type pad 450 and the N-type bonding pad 451b in the sub-pixel regions 401a of a second row R2 are connected to the ground line GND5 through the corresponding first switching element 440a and the corresponding second switching element 440b. The P-type pad 450 and the N-type bonding pad 451b in the sub-pixel regions 401a of a second row R3 are connected to the ground line GND6 through the corresponding first switching element 440a and the corresponding second switching element 440b.

Figure 6A:
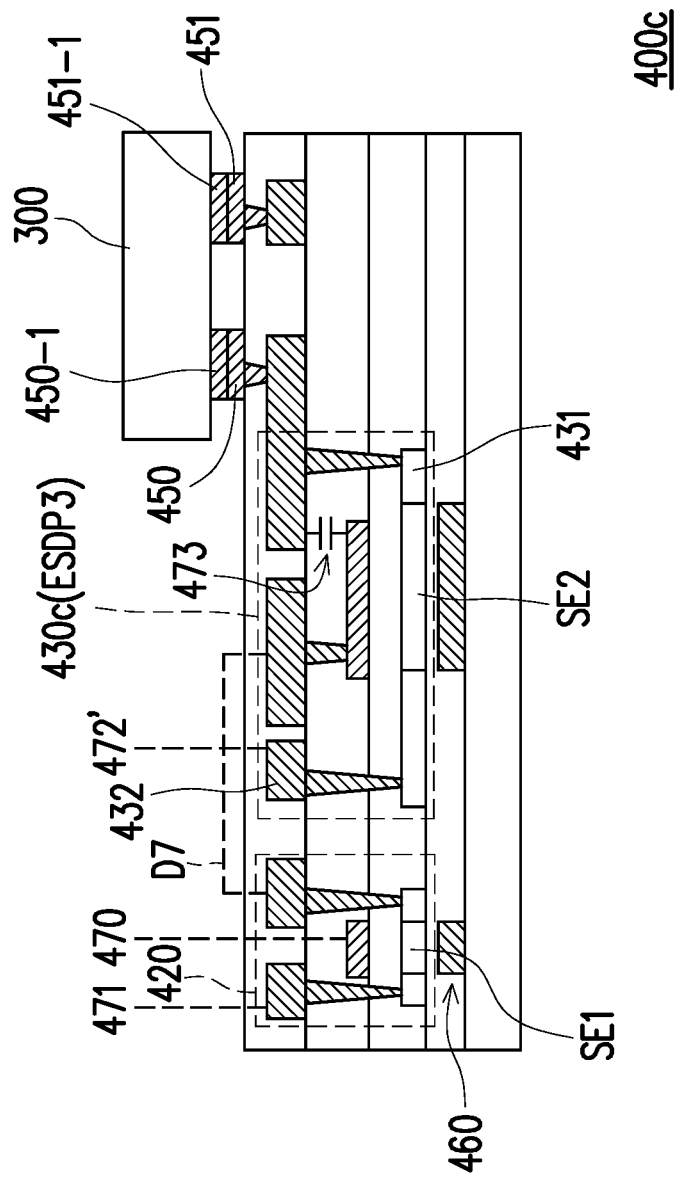
FIG. 6A is a schematic cross-sectional view of an object substrate when transferring a plurality of light emitting units according to another embodiment of the disclosure.
Figure 6B:
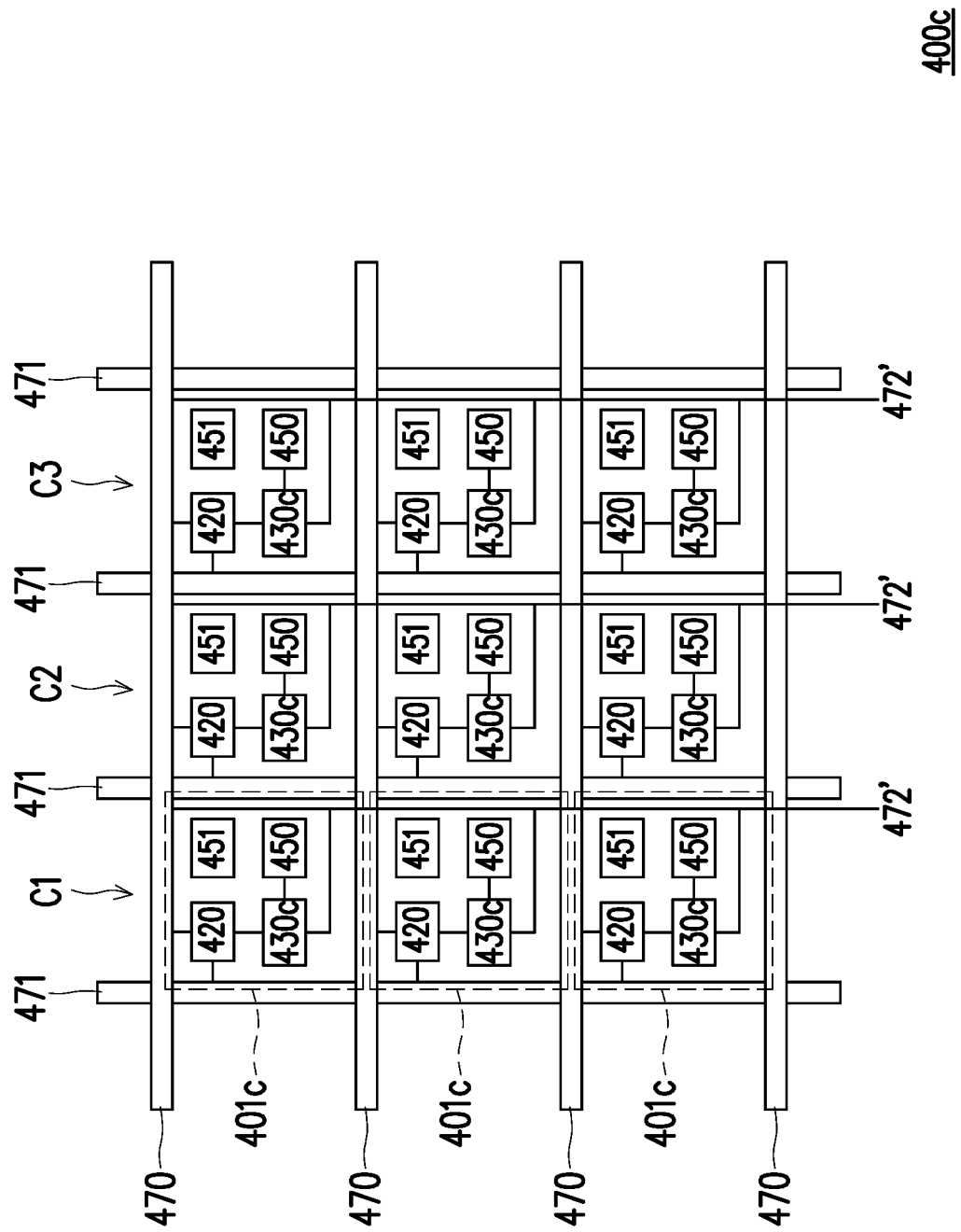
FIG. 6B is a schematic top view of grounding the electrostatic discharge protective units of the object substrate in FIG. 6A.

FIG. 6A is a schematic cross-sectional view of an object substrate when transferring a plurality of light emitting units according to another embodiment of the disclosure. FIG. 6B is a schematic top view of grounding the electrostatic discharge protective units of the object substrate in FIG. 6A. Please referring to FIG. 3A and FIG. 6A, an object substrate 400c in the present embodiment is substantially similar to the object substrate 400 in FIG. 3A. The object substrate 400c is different from the object substrate 400 mainly in that: the object substrate 400c does not include a first switching element.

Specifically, referring to FIG. 6A and FIG. 6B in the present embodiment, a second thin film transistor 430c disposed in a pixel region 401c of the object substrate 400c is connected to a signal line 472' through a source 432 of the second thin film transistor 430c, as shown by a dotted line D7. It should be noted that, the signal line 472' transfers a low potential or ground potential (GND) under a protection by at least one electrostatic discharge protective unit, and how to transfer the potentials through the signal line 472' in different states can be referred to FIG. 6C-6D. In other words, a P-type bonding pad 450 may be electrically connected to the low potential or the ground GND through the second thin film transistor 430c, but is not limited thereto. It should be noted that, the signal line 472' transfers a high potential (such as VDD) under driving the pixel. It should be noted that, the potentials (the high potential, the low potential or ground potential) transferred by the signal line 472' may be switched through IC chip (not shown) or controller (not shown).

Referring to FIG. 6B, in the present embodiment, the object substrate 400c has a plurality of sub-pixel regions 401c arranged in an array (schematically shown as 9 sub-pixel regions in FIG. 6B, but is not limited thereto). The plurality of sub-pixel regions 401c are defined by staggering scan lines 470 and data lines 471 with each other. The P-type bonding pad 450 in the sub-pixel regions 401c of the column C1 (column C2 or column C3) are connected to the signal line 472' through the corresponding second thin film transistor 430c. The signal lines 472' transfer a low potential or ground potential (GND) under a protection by at least one electrostatic discharge protective unit.

Therefore, in the present embodiment, the second thin film transistor 430c of the object substrate 400c can be regarded as a third electrostatic discharge protective unit ESDP3. The third electrostatic discharge protective unit ESDP3 is located in the object substrate 400c and is electrically connected to the P-type bonding pad 450. In other embodiments, the P-type bonding pad 450 and N-type bonding pad 451 are replaced with each other.

Figure 6C:
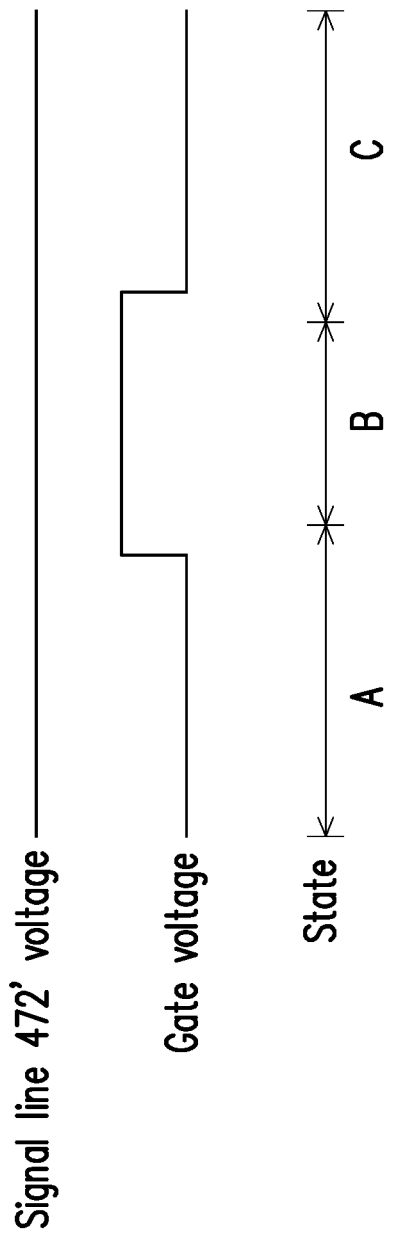
FIG. 6C is a timing diagram of a data line voltage and a gate voltage of FIG. 6A.
Figure 6D:
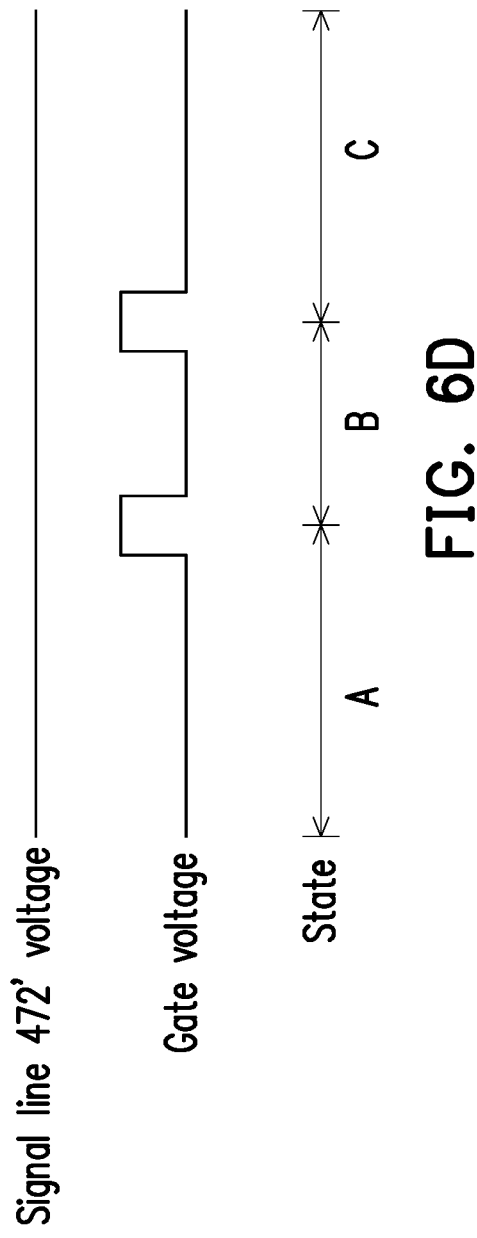
FIG. 6D is another timing diagram of a data line voltage and a gate voltage of FIG. 6A.

Next, a design of a data line voltage and a gate voltage during the step of placing the plurality of light-emitting units 300 onto the object substrate 400c will be exemplified. FIG. 6C is a timing diagram of a data line voltage and a gate voltage of FIG. 6A. FIG. 6D is another timing diagram of a data line voltage and a gate voltage of FIG. 6A.

Referring to FIG. 6C, in the present embodiment, during the step of placing the plurality of light emitting units 300 onto the object substrate 400c, the interaction relationship between the pick-and-place tool, the plurality of light emitting units 300, and the object substrate 400c can be divided into three states. State A: the plurality of light emitting units 300 are located on the pick-and-place tool. In other word, the plurality of light emitting units 300 are picked up by the pick-and-place tool. State B: the plurality of light emitting units 300 located on the pick-and-place tool contact to the P-type bonding pad 450 and the N-type bonding pad 451 of the object substrate 400c. State C: the plurality of light emitting units 300 detached from the pick-and-place tool are bonded to the P-type bonding pad 450 and the N-type bonding pad 451 of the object substrate 400c.

In the present embodiment, the signal line 472' voltage may be 0V (ground potential) or a low potential in the state A to state C. The gate voltage (such as scan line 470 voltage)

may be 0V or low potential in the beginning of the state A. However, before preparing to enter the state B, the gate voltage may be a high potential, and the gate voltage (high potential) may be continued to be provided until entering into the state C, the gate voltage can be switched or restored to 0V or low potential.

Referring to FIG. 6D, in some embodiment, the design of the signal line 472' voltage and the gate voltage may be different from FIG. 6C mainly in that: before preparing to enter the state B, the gate voltage may be a high potential. However, after entering into state B, the gate voltage may be switched or restored to 0V or low potential in part of time of the state B, and then the gate voltage may be switched to the high potential again in part of time of the state B. Then, before preparing to enter the state C, the gate voltage may be continued a high potential until entering into the state C.

Figure 7:
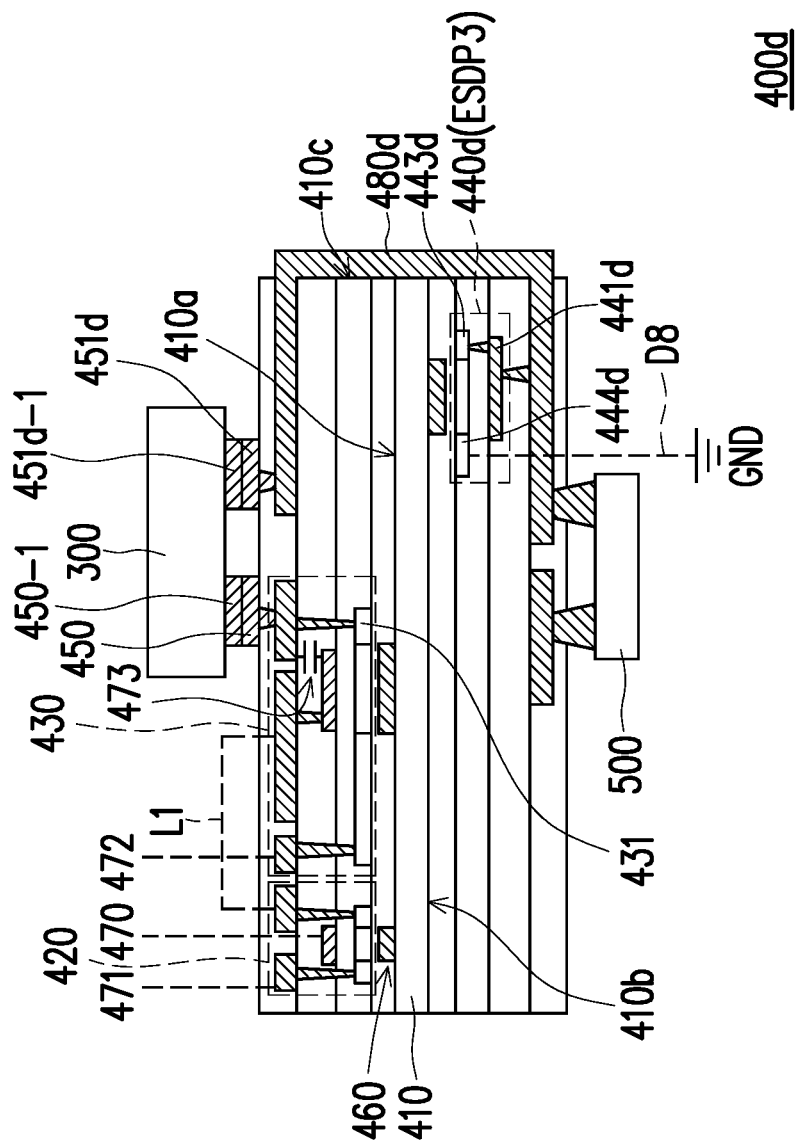
FIG. 7 is a schematic cross-sectional view of an object substrate when transferring a plurality of light emitting units according to another embodiment of the disclosure.

FIG. 7 is a schematic cross-sectional view of an object substrate when transferring a plurality of light emitting units according to another embodiment of the disclosure. Please referring to FIG. 3A and FIG. 7, an object substrate 400d is substantially similar to the object substrate 400 in FIG. 3A. The object substrate 400d is different from the object substrate 400 mainly in that: a first switching element 440d of the object substrate 400d may be electrically connected to a second thin film transistor 430 through the light emitting unit 300, the first switching element 440d may be electrically connected to the N-type bonding pad 451d, the P-type bonding pad 450 may be electrically connected to the second thin film transistor 430, and the first switching element 440d and a second thin film transistor 430 are respectively disposed at two opposite sides of the substrate 410.

The first switching element 440d may be disposed in a non-pixel region of the object substrate 400, but is not limited thereto. In other embodiments, in a normal direction of the substrate 410, the first switching element 440d may overlap with the light emitting unit 300, but is not limited thereto.

Specifically, in the present embodiment, the substrate 410 includes an upper surface 410a and a bottom surface 410b opposite to the upper surface 410a. A first thin film transistor 420, the second thin film transistor 430 and a light emitting unit 300 are disposed on the supper surface 410a of the substrate 410, and the first switching element 440d and a chip 500 are disposed on the bottom surface 410b of the substrate 410. In some embodiments, the substrate 410 includes a side surface 410c connecting with the upper surface 410a and bottom 410b, a conductive wire 480d is disposed on the upper surface 410a and extends along a side surface 410c to the bottom surface 410b. The conductive wire 480d is electrically connected to the N-type bonding pad 451d, the first switching element 440d and the chip 500. Specifically, the N-type bonding pad 451d may be electrically connected to a gate 441d of the first switching element 440d through the conductive wire 480d, and the gate 441d of the first switching element 440d may be electrically connected to a source region 443d of the first switching element 440d. The chip 500 may be electrically connected to the gate 441d of the first switching element 440d through the conductive wire 480d.

In the present embodiment, the first switching element 440d is connected to a ground GND (or low potential, not shown) through a drain region 444d of the first switching element 440d, as shown by a dotted line D8. In other words, the N-type bonding pad 451d can be electrically connected to the ground GND (or low potential, not shown) through the conductive wire 480d and the first switching element 440d, but is not limited thereto.

Therefore, in the present embodiment, the first switching element 440d provided or located in the object substrate 400d can be regarded as a third electrostatic discharge protective unit ESDP3. In other words, the third electrostatic discharge protective unit ESDP3 is the first switching element 440d. The third electrostatic discharge protective unit ESDP3 is located in the non-pixel region of the object substrate 400d and is electrically connected to the N-type bonding pad 451d through the conductive wire 480d (such as a side conductive wire), but is not limited thereto.

Figure 8:
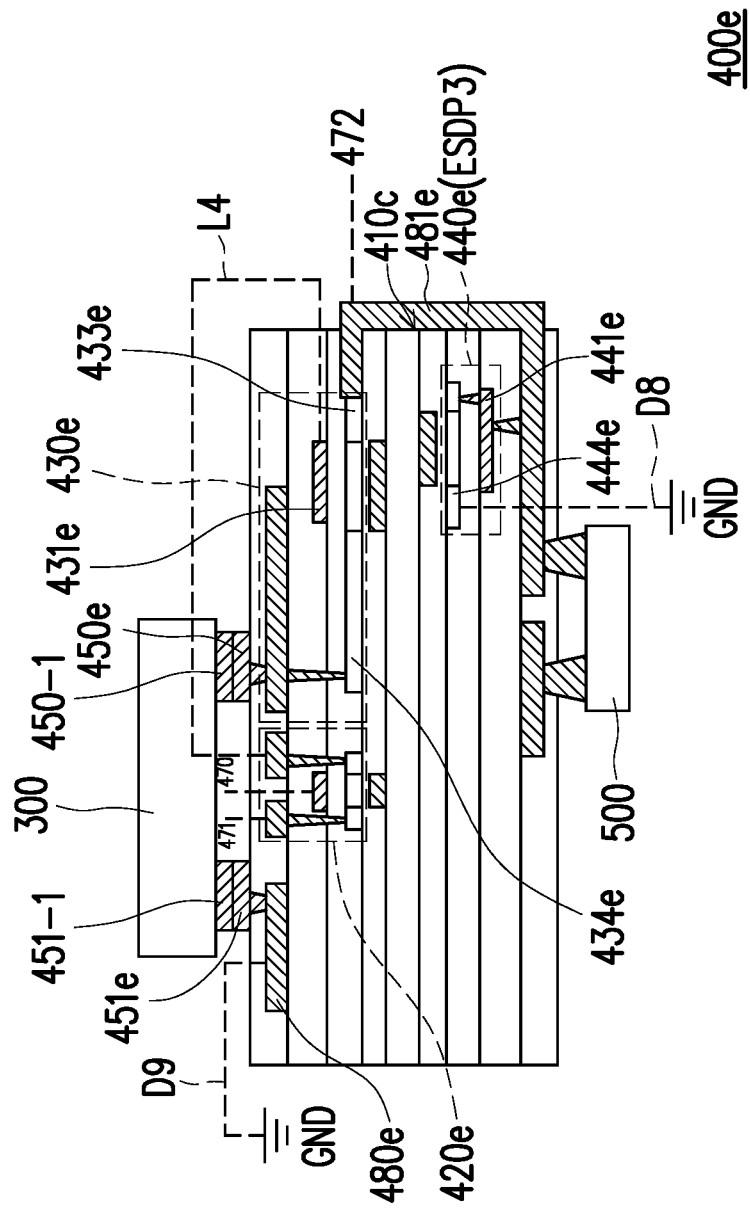
FIG. 8 is a schematic cross-sectional view of an object substrate when transferring a plurality of light emitting units according to another embodiment of the disclosure.

FIG. 8 is a schematic cross-sectional view of an object substrate when transferring a plurality of light emitting units according to another embodiment of the disclosure. Please referring to FIG. 7 and FIG. 8, an object substrate 400e is substantially similar to the object substrate 400d in FIG. 7. The object substrate 400e is different from the object substrate 400d mainly in that: a first switching element 440e (a gate 441e of the first switching element 440e) of the object substrate 400d may be electrically connected to the second thin film transistor 430e through a conductive wire 481e, and the first switching element 440e is electrically connected to the P-type bonding pad 450e through the second thin film transistor 430e (such as a source region 434e of the second thin film transistor 430e). In the present embodiment, the second thin film transistor 430e may contact and/or be electrically connected to the conductive wire 481e through a drain region 433e of the second thin film transistor 430e.

In the present embodiment, a gate 441e of the first switching element 440e is electrically connected to a chip 500 and/or the conductive wire 481e. A first thin film transistor 420e (such as drain region) is electrically connected to a gate 431e of the second thin film transistor 430e through a wire of other cross-section (as shown by the dashed line L4). In the present embodiment, the first switching element 440e disposed in a non-pixel region of the object substrate 400e is connected to a ground GND (or low potential, not shown) through the drain region 444e of the first switching element 440e, as shown by a dotted line D8. In other words, the P-type bonding pad 450e can be electrically connected to the ground GND (or low potential, not shown) through the second thin film transistor 430e, the conductive wire 481e and the first switching element 440e. In addition, the N-type bonding pad 451e is connected to a ground GND through the conductive wire 480e, as shown by a dotted line D9.

In the present embodiment, the first switching element 440e provided or located in the object substrate 400e can be regarded as a third electrostatic discharge protective unit ESDP3. In other words, the third electrostatic discharge protective unit ESDP3 is the first switching element 440e. The third electrostatic discharge protective unit ESDP3 is located in the non-pixel region of the object substrate 400e, and the third electrostatic discharge protective unit ESDP3 is electrically connected to the P-type bonding pad 450e through the conductive wire 480e (such as a side conductive wire), but is not limited thereto.

Figure 9A:
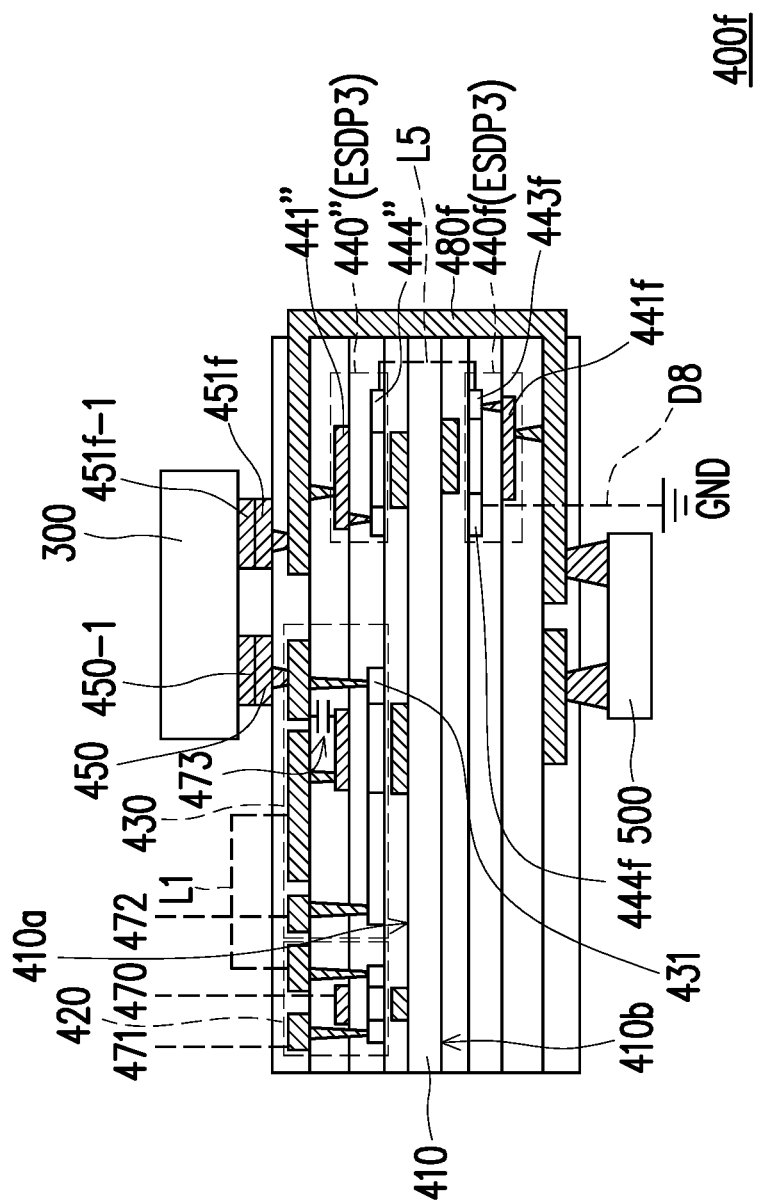
FIG. 9A is a schematic cross-sectional view of an object substrate when transferring a plurality of light emitting units according to another embodiment of the disclosure.
Figure 9B:
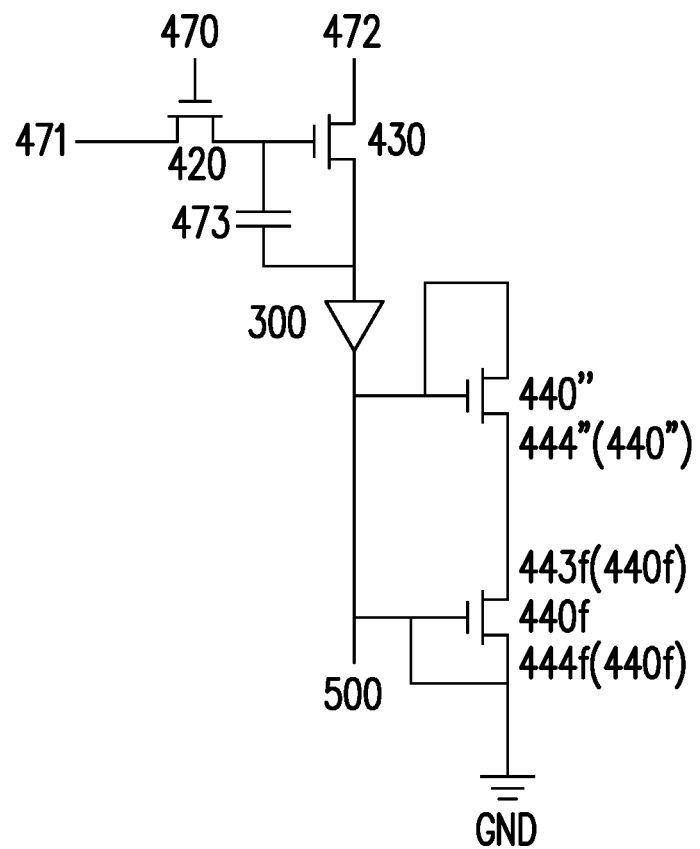
FIG. 9B is a schematic circuit diagram of the object substrate in FIG. 9A.

FIG. 9A is a schematic cross-sectional view of an object substrate when transferring a plurality of light emitting units according to another embodiment of the disclosure. FIG. 9B is a schematic circuit diagram of the object substrate in FIG. 9A. Please referring to FIG. 7 and FIG. 9A, an object substrate 400f in the present embodiment is substantially similar to the object substrate 400d in FIG. 7. The object substrate 400f is different from the object substrate 400d mainly in that: the object substrate 400f further includes a second switching element 440".

In the present embodiment, a first thin film transistor 420, a second thin film transistor 430 and the second switching element 440" are disposed on an upper surface 410a of a substrate 410. The second thin film transistor 430 is located or connected between the first thin film transistor 420 and the second switching element 440". A first switching element 440f and a chip 500 are disposed on a bottom surface 410b of a substrate 410. The second switching element 440" and the first switching element 440f are respectively disposed at two opposite surfaces of the substrate 410 (such as the bottom surface 410b and the upper surface 410a).

A conductive wire 480f is electrically connected to a N-type bonding pad 451f, the second switching element 440" (such as a gate 441" of the second switching element 440"), the first switching element 440f (such as a gate 441f of the first switching element 440f) and the chip 500. The N-type bonding pad 451f may be electrically connected to a gate 441f of the first switching element 440f through the conductive wire 480f, and the gate 441f of the first switching element 440f is electrically connected to a source region 443f of the first switching element 440f.

In the present embodiment, a drain region 444" of the second switching element 440" is connected to a source region 443f of the first switching element 440f, as shown by a dotted line L5. A drain region 444f of the first switching element 440f disposed in a non-pixel region of the object substrate 400f is connected to a ground GND (or low potential, not shown), as shown by a dotted line D8. In other words, the N-type bonding pad 451f can be electrically connected to the ground GND (or low potential, not shown) through the conductive wire 480f and/or the first switching element 440f, but is not limited thereto.

In the present embodiment, the first switching element 440f and the second switching element 440" provided or located in the object substrate 400f can be regarded as a third electrostatic discharge protective unit ESDP3. In other words, the third electrostatic discharge protective unit ESDP3 is a combination of the switching elements, such as a combination of the first switching element 440f and the second switching element 440". The number of the switching elements may be adjusted according to demand. The part of the third electrostatic discharge protective unit ESDP3 is located in the pixel region of the object substrate 400f, and part of the third electrostatic discharge protective unit ESDP3 is located in the non-pixel region of the object substrate 400f, and the third electrostatic discharge protective unit ESDP3 of the object substrate 400f is electrically connected to the N-type bonding pad 451f, but is not limited thereto. In other embodiment, the third electrostatic discharge protective unit ESDP3 is located in the non-pixel region.

Referring FIG. 9B, in the present embodiment, the object substrate 400f may include scan lines 470, data lines 471, power supply lines 472 (such as VDD), capacitance 473, signal reference wires 500 (such as VSS), but is not limited thereto.

In some embodiments (not shown), an ion fan may be used as an electrostatic discharge protective unit. Specifically, positive or negative ions provided by the ion fan are used to neutralize the electrostatic discharge generated during the step of transferring a plurality of light emitting units from a carrier substrate to an object substrate. For example, before picking the plurality of light emitting units from the carrier substrate, the ion fan is turned on to generate positive ions (or negative ions) to neutralize the electrostatic discharge generated when the grasping heads of the pick-and-place tool contact the plurality of light emitting units, but is not limited thereto. In addition, before placing the plurality of light emitting units onto the object substrate, the ion fan is turned on to generate negative ions (or positive ions) to neutralize the electrostatic discharge generated when the plurality of light emitting units contact to the object substrate, but is not limited thereto.

It should be noted that, the first electrostatic discharge ESDP1 can represent the electrostatic discharge protective unit located in the pick-and-place tool in the following claims, the second electrostatic discharge ESDP2 can represent the electrostatic discharge protective unit located in the carrier substrate in the following claims, and the third electrostatic discharge ESDP3 can represent the electrostatic discharge protective unit located in the object substrate in the following claims.

According to the above-mentioned contents, the method for manufacturing an electronic device comprises: transferring a plurality of light emitting units 300 from a carrier substrate (200 or 200a) to an object substrate (400, 400a, 400c, 400d, 400e or 400f) through steps of: picking the plurality of light emitting units 300 from the carrier substrate (200 or 200a) by a pick-and-place tool 100, and placing the plurality of light emitting units 300 onto the object substrate (400, 400a, 400c, 400d, 400e or 400f), wherein the steps are both performed under a protection by at least one electrostatic discharge protective unit (ESDP1, ESDP2 or ESDP3).

According to the above-mentioned contents, the electronic device comprises at least one first electrostatic discharge protective unit (ESDP1) located in the pick-and-place tool 100 or at least one second electrostatic discharge protective unit (ESDP2) located in the carrier substrate (200 or 200a) and/or at least one third electrostatic discharge protective unit (ESDP3) located in the object substrate (400, 400a, 400c, 400d, 400e or 400f).

The method for manufacturing an electronic device comprise: grounding the at least one first electrostatic discharge protective unit (ESDP1) during the step of transferring the plurality of light emitting units 300 from the carrier substrate (200 or 200a) to the object substrate (400, 400a, 400c, 400d, 400e or 400f) when the at least one electrostatic discharge protective unit comprises at least one first electrostatic discharge protective unit (ESDP1).

The method for manufacturing an electronic device comprise: grounding the at least one second electrostatic discharge protective unit (ESDP2) located in the carrier substrate (200 or 200a) and/or the at least one third electrostatic discharge protective unit (ESDP3) located in the object substrate (400, 400a, 400c, 400d, 400e or 400f) during the step of transferring the plurality of light emitting units 300 from the carrier substrate (200 or 200a) to the object substrate (400, 400a, 400c, 400d, 400e or 400f) when the at least one electrostatic discharge protective unit comprises at least one second electrostatic discharge protective unit (ESDP2) and/or third electrostatic discharge protective unit (ESDP3).

According to the above-mentioned contents, the at least one third electrostatic discharge protective unit ESDP3 located in the object substrate (400, 400a, 400c, 400d, 400e or 400f) is electrically connected to the plurality of bonding pads (such as P-type bonding pads or N-type bonding pads of the object substrate). In some embodiments, the at least one third electrostatic discharge protective unit ESDP3 located in the object substrate comprises a plurality of switches (such as the first switching elements and/or second switching elements) for grounding the bonding pads of the object substrate (such as P-type bonding pads or N-type bonding pads) during the step of transferring the plurality of light emitting units 300 from the carrier substrate (200 or 200a) to the object substrate (400, 400a, 400c, 400d, 400e or 400f).

In summary, in the method of manufacturing the electronic device according to the embodiment of the present disclosure, by providing the at least one electrostatic discharge protective unit in a pick-and-place tool, a carrier substrate and/or an object substrate, the electronic device can be reduced from being damaged by electrostatic discharge during the step of transferring the plurality of light emitting units from the carrier substrate to the object substrate. Therefore, the method for manufacturing the electronic device according to the embodiments has the effect of increasing the quality or reliability of the electronic device.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electronic device, comprising:
   an object substrate comprising a bonding pad;
   an electronic unit comprising an electrode bonding on the bonding pad; and
   an electrostatic discharge protective unit located in the object substrate and electrically connected to the bonding pad; and
   a switching transistor located in the object substrate, wherein the switching transistor has a semiconductor layer,
   wherein the electrostatic discharge protective unit comprises a switching element having a semiconductor layer, and the semiconductor layer of the switching transistor and the semiconductor layer of the switching element are formed of the same semiconductor layer.

2. The electronic device according to claim 1, wherein the electronic unit comprises a diode.

3. The electronic device according to claim 1, wherein the electronic unit comprises a chip.

4. The electronic device according to claim 1, wherein the bonding pad of the object substrate is electrically connected to a ground or a low potential through the electrostatic discharge protective unit.

5. The electronic device according to claim 1, wherein the electrostatic discharge protective unit comprises a back-to-back diode.

6. The electronic device according to claim 5, wherein the object substrate further comprises another bonding pad, the electronic unit further comprises another electrode bonding on the another bonding pad, the bonding pad and the another bonding pad are electrically connected through the electrostatic discharge protective unit.

7. The electronic device according to claim 1, wherein the bonding pad is disposed in a sub-pixel region of the electronic device.

8. The electronic device according to claim 1, wherein the object substrate comprises a side surface, and the electrostatic discharge protective unit is electrically connected to a ground through a conductive wire disposed on the side surface.

* * * * *